(12) United States Patent
Kang

(10) Patent No.: US 6,563,177 B2
(45) Date of Patent: *May 13, 2003

(54) SEMICONDUCTOR MEMORY DEVICE HAVING A TRENCH AND A GATE ELECTRODE VERTICALLY FORMED ON A WALL OF THE TRENCH

(75) Inventor: Seen-Suk Kang, Seoul (KR)

(73) Assignee: Hyundai Electronics Industries Co. Ltd., Kyoungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,116

(22) Filed: Jul. 22, 1998

(65) Prior Publication Data

US 2002/0027227 A1 Mar. 7, 2002

(30) Foreign Application Priority Data

Sep. 23, 1997 (KR) .............................. 97-48162

(51) Int. Cl.$^7$ ..................... H01L 29/76; H01L 31/036; H01L 27/11

(52) U.S. Cl. .................... 257/368; 257/66; 257/903; 257/904

(58) Field of Search ................ 257/66, 368, 903, 257/904, 329

(56) References Cited

U.S. PATENT DOCUMENTS

| 4,890,144 A | 12/1989 | Teng et al. ............... 357/23.4 |
| 5,016,067 A | 5/1991 | Mori ....................... 357/23.4 |
| 5,258,635 A | * 11/1993 | Nitayama et al. .......... 257/329 |
| 5,285,093 A | 2/1994 | Lage et al. ................ 257/332 |
| 5,376,814 A | * 12/1994 | Lee ......................... 257/903 |
| 5,422,296 A | 6/1995 | Lage ........................ 437/52 |

FOREIGN PATENT DOCUMENTS

JP  01-265558  * 10/1989 .............. 257/904

* cited by examiner

Primary Examiner—Steven Loke
(74) Attorney, Agent, or Firm—Morgan, Lewis & Bockius LLP

(57) ABSTRACT

A semiconductor memory device includes a trench type SRAM(Static Random Access Memory) cell having a higher integration than a stack type SRAM. The SRAM cell memory device is provided with a trench formed in a semiconductor substrate and having four side walls therein, wherein a source region and a drain region of each of first and second drive transistors are formed in two of the four side walls. A pair of active layers respectively having a source region and a drain region of a first load transistor and a second load transistor, respectively, are formed on the substrate adjacent to the side walls. A gate electrode common to the first drive transistor and the first load transistor is formed on a gate oxide film. A gate electrode of an access transistor is vertically formed in a direction vertical to the semiconductor substrate instead of being formed on the substrate for thereby decreasing an area to be occupied by the transistor.

17 Claims, 15 Drawing Sheets

US 6,563,177 B2

SEMICONDUCTOR MEMORY DEVICE HAVING A TRENCH AND A GATE ELECTRODE VERTICALLY FORMED ON A WALL OF THE TRENCH

BACKGROUND OF THE INVENTION

1. Field of the Invention

The present invention relates to a semiconductor memory device and fabrication method thereof.

2. Background of the Art

An SRAM(Static Random Access Memory) cell, also referred to as a flip-flop, is composed of a pair of cross-coupled inverters. That is, the memory cell's logic state is determined by a voltage level of each a pair of inverter output nodes, and when an inverter output node to which a supply voltage is applied is at a low voltage level, the other inverter output node maintains a high voltage level. Once the memory cell becomes stabilized, the stable state is maintained, so that a SRAM cell does not require a periodic refresh operation for having data stored therein, and such a characteristic of the SRAM cell is distinguishable from a DRAM (Dynamic Random Access Memory) cell. As a result, an SRAM cell is more stably operated than a DRAM cell, with a less power consumption. Also, due to self-restoring, peripheral circuits characteristics, the SRAM cell is operated in a faster mode, compared to other kinds of semiconductor memory cells.

However, it is known a disadvantage of the SRAM cell that the SRAM cell requires at least 6 transistors for forming a single cell of the kind and accordingly exhibits a lower integration factor.

To solve the above-described disadvantage, there has been proposed a high-resistance load cell for 1 Mbit SRAMs by taking advantage of a polysilicon resistor, which permits a smaller region to be occupied by a memory, cell. Here, because the SRAM cell is provided with a four-transistor set and a polysilicon resistor, it is advantageous compared to a six-transistor SRAM in terms of the chip region occupied thereby. However, in a greater than 4 Mbit SRAM, a six-transistor TFT (Thin Film Transistor) SRAM cell is widely adopted mainly due to a cell data retention stability and reduced current consumption, even though the TFT SRAM cell is composed of a six-transistor set, and further TFT SRAM cell occupies a larger region than a high-resistance load SRAM cell which employs a polysilicon resistor.

With reference to FIG. 1, an equivalent circuit of a conventional SRAM cell is provided with a pair of NMOS access transistors Ta1, Ta2, a pair of NMOS drive transistors Td1, Td2, and a pair of PMOS load transistors Tl1, Tl2, wherein the access transistors Ta1, Ta2 will be referred to as a first and second access transistors, the drive transistors Td1, Td2 will be respectively referred to as the first and second drive transistors, and the load transistors Tl1, Tl2 will be respectively referred to as first and second load transistors or first and second load resistors.

The gates of the first and second access transistors Ta1, Ta2 are respectively connected to a word line. One end of the channel of the first access transistor Ta1 is connected to a bit line BL, and node A connected to the other end of the channel of the first access transistor Ta1 is connected in common to the gate of the second load transistor Tl2 and the gate of the second drive transistor Td2. One end of the channel of the second access transistor Ta2 is connected to a complementary bar bit line /BL, and node B of the second access transistor Ta2 is connected in common to the gate of the first load transistor Tl1 and the gate of the first drive transistor Td1. The source region of each of the first and second load transistors Tl1, Tl2 is connected in common to high level supply voltage Vdd, and the source region of each of the first and second drive transistors Td1, Td2 is connected in common to ground voltage Vss.

The operation of the thusly-constituted SRAM cell will now be described.

First, referring to a write operation of the SRAM, in order to write a data "1" in an SRAM cell, when a word line voltage is raised to a level of supply voltage Vdd so as to turn on the first and second access transistors Ta1, Ta2, the high level supply voltage Vdd is applied to the bit line BL, and the low level ground voltage Vss is applied to the bar bit line /BL, then the voltage at node A becomes a value of Vdd-Vth, whereby the second drive transistor Td2 is turned on and the second load transistor Tl2 is turned off. The voltage at node B becomes practically 0V, so that the first load transistor Tl1 becomes turned on and the first drive transistor Td1 is turned off, whereby data "1" is transferred to the SRAM cell. So long as current is continuously supplied after a data voltage of the SRAM cell is determined, the first load transistor Tl1 remains turned on so that the supply voltage Vdd is applied via the first load transistor Tl1 to the node A, and the second drive transistor Td2 remains turned on so that the current of node B flows through the second drive transistor Td2 to ground Vss, whereby node A is turned to a high level and node B is turned to a low level so as to maintain the stored data. The steps contrary to those for a data "1" are taken for a data "0". That is, the low-level voltage Vss is applied to the bit line BL, and the high level voltage Vdd is applied to the bar bit line /BL, so that the node A maintains a low level and the node B maintains a high level.

A read operation will now be described. Assuming that a data "1" is written into the SRAM cell, node A is a high level and node B is a low level. The respective charges of bit line pair BL, /BL for reading data are set at about 3V which is an operation point of a sense amplifier in order equalize the bit line pair BL, /BL with regard to voltage. The word line voltage is raised to the level of supply voltage Vdd, and the first and second access transistors Ta1, Ta2 are turned on so as to select the target SRAM cell for carrying out a reading operation. Then, the voltage of the bit line BL is slightly raised toward the level of Vdd due to the current which flows in through the first load transistor Tl1, and the voltage of the bar bit line /BL flows to ground Vss and is slightly lowered, accordingly. At this time, the potential difference between the bit line BL and the bar bit line /BL is amplified in the sense amplifier (not shown) and transferred to an output buffer (not shown). Here, the reading of the data "0" follows steps identical to those for a data "1", wherein the voltage fluctuation of the bit line BL and the bar bit line /BL is reversed compared to the case of a data "1".

Meanwhile, in a TFT SRAM serving as one of the thusly operated SRAM kinds wherein the objective of such TFT SRAM is to increase the integration degree, the first and second drive transistors Td1, Td2 and the first and second access transistors Ta1, Ta2 are respectively formed of a bulk transistor, and because the first and second load transistors Tl1, Tl2 are respectively provided with a structure in which the transistors Tl1, Tl2 are sequentially stacked on the first and second drive transistors Td1, Td2, the TFT SRAM becomes advantageous in that it requires less chip region than a general SRAM.

With reference to FIG. 2 illustrating a plan layout view of a conventional TFT SRAM and to FIGS. 3A–3G showing fabrication sequence cross-sectional views thereof, the structure of the TFT SRAM will now be described.

As shown therein, on a semiconductor substrate 1 there is formed a device isolation region 2a. On the region of the substrate 1 other than the device isolation region 2a are formed the first and second access transistors Ta1, Ta2 and the first and second drive transistors Td1, Td2. That is, on the semiconductor substrate 1 are respectively formed gate electrodes 5a1, 5a2 of the first and second access transistors Ta1, Ta2. In the semiconductor substrate 1 and on each side of the gate electrodes 5a1, 5a2 of the first and second access transistors Ta1, Ta2 there are formed the source region regions 3a1, 3a2 and drain regions 4a1, 4a2, wherein the first access transistor Ta1 includes gate electrode 5a1, source region 3a1, and drain region 4a1, and the second access transistor Ta2 is provided with gate electrode 5a2 connected to the gate electrode 5a1, source region 3a2 and drain region 4a2.

Gate electrodes 5d1, 5d2 of the first and second drive transistors Td1, Td2 are formed on the semiconductor substrate 1. On the semiconductor substrate 1 and adjacent to sides of the gate electrodes 5d1, 5d2 of the first and second drive transistors Td2, Td2 are formed source regions 3d1, 3d2 and drain regions 4d1, 4d2 of the first and second drive transistors Td1, Td2, wherein the first drive transistor Td1 includes the gate electrode 5d1, source region 3d1, and drain region 4d1, and the second drive transistor Td2 is provided with gate electrode 5d2, source region 3d2 and drain region 4d2.

The drain region 4a1 of the first access transistor Ta1 is connected by a butting contact to the gate electrode 5d2 of the second drive transistor Td2. The drain region 4a2 of the second access transistor Ta2 is connected by a butting contact to the gate electrode 5a1 of the first drive transistor Td1, but the respective contact regions thereof are not shown in the drawings.

Using the substrate 1 and the upper surface thereof, a gate electrode 7l1 of the first load transistor Tl1 and a gate electrode 7l2 of the second load transistor Tl2 are formed on the first and second drive transistors Td1, Td2. An active layer 9 of the first and second load transistors is formed on the gate electrodes 7l1, 7l2 of the first and second load transistors Tl1, Tl2. In the active layer 9 are formed source region regions 10l1, 10l2 and drain regions 11l1, 11l2 of the first and second load transistors Tl1, Tl2. The source region regions 10l1, 10l2 of the first and second load transistors Tl1, Tl2 are respectively connected to a Vdd line. The node A as shown in FIG. 1 denoting a contact point between the drain region 3d1 of the first drive transistor Td1 and the drain 11l1 of the first load transistor Tl1 is connected through a first contact hole CT1 and a second contact hole CT2 to the gate electrode 5d2 of the second drive transistor Td2 and the gate electrode 7l2 of the second load transistor Tl2. Also, the node B shown in FIG. 1 denoting a contact point between the drain 3d2 of the second drive transistor Td2 and the drain 11l2 of the second load transistor Tl2 is connected through a third contact hole CT3 and a fourth contact hole CT4 to the gate electrode 5d1 of the first drive transistor Td1 and the gate electrode 7l1 of the first load transistor Tl1.

With reference to FIGS. 3A through 3G illustrating cross-sectional process views taken along line III—III in FIG. 2, the fabrication process thusly constituted conventional stack type TFT SRAM cell will now be described.

As shown in FIGS. 2 and 3A, in an upper surface of a p-type semiconductor substrate 1 there are formed device isolation regions 2a and active regions 2b respectively of a gate oxide film 41, wherein the device isolation regions 2a are formed using a LOCOS (LOCal Oxidation on Silicon) method. On the active regions 2b of the gate oxide film 41 is deposited a polysilicon layer which is then patterned for thereby forming the gate electrodes 5a1, 5a2 of the first and second access transistors Ta1, Ta2.

In order to form source regions 3a1, 3a2 and drains 4a1, 4a2 of the first and second access transistor Ta1, Ta2, n-type impurities are ion-implanted into portions of the substrate 1 adjacent to each side of the gate electrode 5a1, 5a2 for thereby forming source regions 3a1, 3a2 and drains 4a1, 4a2 of the first and second access transistors Ta1, Ta2.

As further shown in FIGS. 2 and 3B, a photoresist film 42 is formed on the gate oxide film 41 including the patterned gate electrodes 5a1, 5a2 and patterned so as for predetermined portions of the drains 4a1, 4a2 of the first and second access transistors Ta1, Ta2 to be exposed therethrough using a photo lithographic method.

Next, the gate oxide film 41 portions which are on the substrate 1 portion beneath which are formed the drains 4a1, 4a2 of the first and second access transistors Ta1, Ta2 are moved. Here, the gate oxide film 41 is so thin that it is significantly difficult to etchingly remove the gate oxide film 41 without damaging the adjacent drain regions 4a1, 4a2 and causing defects in the first and second access transistors Ta1, Ta2.

Then, after removing the remaining photoresist film 42, another photoresist film (not shown) is formed instead on the remaining patterns as shown in FIG. 3B. The photo resist film (not shown) portions are formed on regions for forming the drive transistors Td1, Td2, and a polysilicon layer is patterned to form the gate electrodes 5d1, 5d2 of the drive transistors Td1, Td2. On the patterns from which the photoresist film is removed a polysilicon layer is selectively deposited for thereby forming the gate electrodes 5d1, 5d2 of the drive transistors Td1, Td2 as shown in FIG. 3C. In FIG. 3C, for convenience' sake, the gate electrode 5d2 of the second drive transistor Td2 is illustrated but the gate electrode 5d1 of the first drive transistor Td1 is not illustrated in FIG. 3C.

Impurities are ion-implanted into the semiconductor substrate 1 adjacent to the sides of the gate electrodes 5d1, 5d2 of the first and second drive transistors Td1, Td2 so as to form source regions (not shown) and drain regions (not shown) of the drive transistors Td1, Td2. The remaining photoresist film 42' is then removed.

With reference to FIGS. 2 and 3D, an SiO2 film serving as a first insulation film 6 is formed with a thickness of 50 100 nm over the thusly formed structure including the gate electrodes 5d1, 5d2 of the first and second drive transistors Td1, Td2 by using a CVD (Chemical Vapor Deposition) process. The contact hole CT3 is formed in a predetermined portion of the gate electrode 5d2 of the second drive transistor Td2, and the contact hole CT1 is formed in a predetermined portion of the gate electrode 5d1 of the first drive transistor Td1.

With further reference to FIG. 3E, a polysilicon layer is formed on the CVD SiO2 film serving as the first insulation film 6 and in the contact holes CT1, CT3 using a LPCVD (Low Pressure Chemical Vapor Deposition) process at a temperature of 630(C. In order to control the threshold voltage Vth of the first and second load transistors Tl1, Tl2, phosphorous impurities are ion-implanted through the poly silicon layer which is then patterned to thereby form gate electrodes 7l1, 7l2 of the first and second load transistors Tl1, Tl2.

Also, as shown in FIG. 3F, a gate oxide film serving as a second insulation film 8 is formed on the gate electrodes 7l1, 7/2 of the first and second load transistors Tl1, Tl2 and the first insulation film, wherein the gate oxide film can be one selected from an SiO2 film using the LPCVD process, a multi-layer film of SiO2/Si3N4, and a TESO film.

As shown in FIG. 3F, on a portion of the gate electrode 7/2 of the second load transistor Tl2 is formed the contact hole CT4 for being connected to the drain 11/1 of the first load transistor Tl1, and on a portion of the gate electrode 7/1 of the first load transistor Tl1 is formed the contact hole CT2 for being connected to the drain region 11/2 of the second load transistor Tl2. Using SiH4 gas, an amorphous silicon layer 9 is formed on the second insulation film 8 and in the contact holes CT2, CT4 with a thickness of less than 40 nm at a temperature of 520 C. by a LPCVD process and patterned. The amorphous silicon layer 9 is annealed at a low temperature in order to be polycrystallized, that is, to be polysiliconized. The low temperature annealing is applied to increase the grains of the polysilicon layer in size; the larger the grains, the better becomes an on/off current characteristic of a transistor. The multi-crystallized polysilicon layer 9 is provided to be used for an active layer and a Vdd line of the first and second load transistors Tl1, Tl2.

Then, as shown in FIG. 3G, a photoresist film is deposited on the active layer 9 and the Vdd line 9 of the first and second load transistors Tl1, Tl2 and patterned by applying an etching so as for only a photo resist film pattern 43a to remain on a channel formation region. Using the patterned photo resist film 43a as a mask, BF2 is ion-implanted with an energy of 25 KeV at a 2–4*1014/cm2 dose, for thereby forming source regions 10/1, 10/2 and drain regions 11/1, 11/2 of the first and second load transistors and a Vdd line.

With the introduction of such a TFT SRAM cell structure in which load transistors are stacked on drive transistors, the region occupied by the transistors has significantly decreased in comparison to a former SRAM cell.

However, with semiconductor devices becoming increasingly more integrated, there has been required an SRAM cell which takes up less area therein for transistors compared to the conventional stack type TFT SRAM cell.

Further, in the conventional stack type TFT SRAM, when a contact is formed to connect a drain of an access transistor and a gate electrode of a drive transistor, there must be carried out a process for removing a gate oxide film on the drain of the access transistor. Here, because the gate oxide film is so thin, the gate oxide film is difficult to remove, thereby repeatability, and the focus has been directed to improvement of the contact process which uses a so-called a butting contact.

SUMMARY OF THE INVENTION

Accordingly, it is an object of the present invention to provide a trench type semiconductor memory cell structure and fabrication method thereof for obtaining a higher integration than a stack type semiconductor memory cell.

It is another object of the present invention to provide a trench type semiconductor memory cell structure and fabrication method thereof for enhancing reliability by excluding a butting contact step during a process in which a drain of an access transistor and a gate of a drive transistor are connected to each other.

To achieve the above-described objects, in a semiconductor memory device provided with first and second access transistors, first and second drive transistors, and first and second load resistors, a first cell node having a first terminal of the first access transistor, a gate electrode of the second drive transistor and the first load resistor connected thereto in common, and a second cell node having a first terminal of the second access transistor, a gate electrode of the first drive transistor and the second load resistor connected thereto in common, the semiconductor memory device according to the present invention includes a trench formed in a semiconductor substrate and having at least two walls including a first wall and a second wall, and the first drive transistor and the second drive transistor including a source region and a drain region respectively formed at the first wall and the second wall of the trench, and a gate electrode respectively formed on the first wall and the second wall of the trench.

Further, to achieve the above-described objects, in a semiconductor memory device provided with a first and a second access transistors, first and a second drive transistors, and first and a second load resistors, a first cell node having a first terminal of the first access transistor, a gate electrode of the second drive transistor and the first load resistor connected thereto in common, and a second cell node having a first terminal of the second access transistor, a gate electrode of the first drive transistor and the second load resistor connected thereto in common, the semiconductor memory device according to the present invention includes a trench formed in a semiconductor substrate and having at least two walls including a first wall and a second wall, and the first access transistor and the second transistor respectively including a respective gate electrode formed at the first and the second walls of the trench, and a source region and a drain region respectively formed at the each side of the corresponding gate electrode in the semiconductor substrate.

Still further, to achieve the above-describe objects, in a semiconductor memory device including first and second access transistors, first and second drive transistors, and first and second load resistors, a first cell node having a first terminal of the first access transistor, a gate electrode of the second drive transistor and the first load resistor connected thereto in common, and a second cell node having a first terminal of the second access transistor, a gate electrode of the first drive transistor and the second load resistor connected thereto in common, the semiconductor memory device according to the present invention comprises a semiconductor substrate, a trench formed in the semiconductor substrate and having at least four walls including a first wall, a third wall and a fourth wall, wherein the first drive transistor and the second drive transistor each including a source region, a drain region and a gate electrode are formed at the first wall and the third wall of the trench, respectively, the first access transistor and the second access transistor each including a source region, a drain region and a gate electrode are formed at the second wall the fourth wall of the trench, respectively, and the first load resistor and the second load resistor are formed over an upper surface of the semiconductor substrate corresponding to the first and third walls of the trench, respectively.

Also, to achieve the above-described objects, there is provided a semiconductor memory device fabrication method according to the present invention which includes the steps of preparing a semiconductor substrate, forming a plurality of first impurity regions in the semiconductor substrate for serving as source regions and drain regions of a first access transistor, a second access transistor, a first drive transistor and a second drive transistor, forming an insulation layer on the semiconductor substrate, forming a first contact hole in one of the plurality of the first impurity regions serving as the drain region of the first drive transistor, and forming a second contact hole in another first impurity region serving as the drain region of the second drive transistor, forming a conductive layer on the insulation layer and in the first and the second contact holes, forming a plurality of second impurity regions in a portion of the conductive layer for serving as source region and drain region of a first and second load transistor, patterning the conductive layer, for forming a first active layer of the first load transistor and a second active layer of the second load transistor, forming a trench having at least four walls including a first wall, a second wall, a third wall and a fourth wall, by etching a portion of the first and the second active layers and the semiconductor substrate to a predetermined depth of the first semiconductor substrate, wherein the plurality of first impurity regions are exposed at the four walls of the trench, and the plurality of second impurity regions are respectively exposed at a side surface of the first and the second active layers, forming a first gate oxide film on the first wall of the trench and a side surface of the first active layer, and forming a second gate oxide film on the third wall of the trench and a side surface of the second active layer, forming a first gate electrode common to the first drive transistor and the first load transistor on the first gate oxide film and forming a second gate electrode common to the second drive transistor and the second load transistor on the second gate oxide film, forming a third gate oxide film on the second wall and the fourth wall of the trench, and forming a gate electrode of the first and the second access transistors on the third gate oxide film.

To further achieve the above-described objects, there is provided a semiconductor memory device fabrication method according to the present invention which includes the steps of preparing a semiconductor substrate, forming a plurality of impurity regions in the semiconductor substrate for serving as source regions and drain regions of a first access transistor, a second access transistor, a first drive transistor and a second drive transistor, forming an insulation layer on the semiconductor substrate, forming a first contact hole in one of the plurality of first impurity regions serving as a drain region of the first drive transistor, and forming a second contact hole in another first impurity region serving as a drain region of the second drive transistor, forming a conductive layer on the insulation layer and in the first and the second contact holes, forming first and second load resistors by patterning the first conductive layer, forming a trench having at least four walls including a fit wall, a second wall, a third wall and a fourth wall, by etching a portion of the semiconductor substrate to a predetermined depth of the semiconductor substrate, wherein the plurality of first impurity regions are exposed at the four walls of the trench, forming a first gate oxide film on the first wall of the trench, and a forming a second gate oxide film on the third wall of the trench, forming a first gate electrode of the first drive transistor on the first gate oxide film and forming a second gate electrode of the second drive transistor on the second gate oxide film, forming a third gate oxide film on the second wall and the fourth wall of the trench, and forming a gate electrode of the first and the second access transistors on the third gate oxide film.

BRIEF DESCRIPTION OF THE DRAWINGS

The present invention will become more clearly understood with reference to the accompanying drawings given only by way of illustrations and thus not limited to the present invention, wherein.

DETAILED DESCRIPTION OF THE INVENTION

With reference to the accompanying drawings, the TFT SRAM cell structure and fabrication method thereof according to the present invention will now be described.

Figure 1:
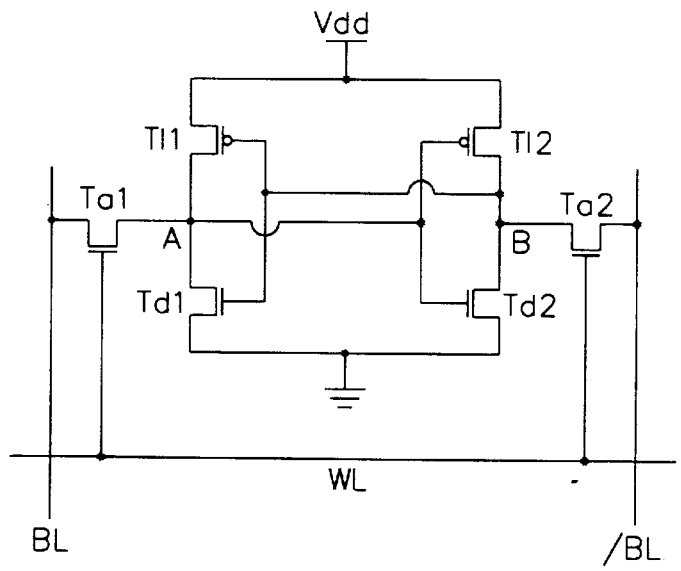
FIG. 1 is an equivalent circuit view of a conventional TFT SRAM cell.
Figure 2:
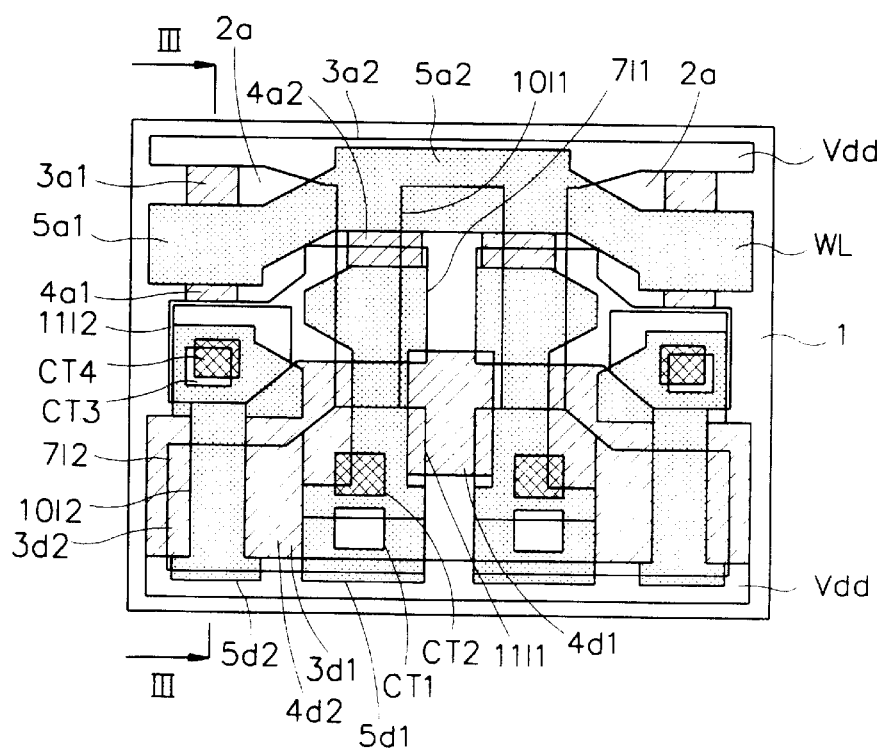
FIG. 2 is a plan layout view of the conventional TFT SRAM cell.
Figure 3A:
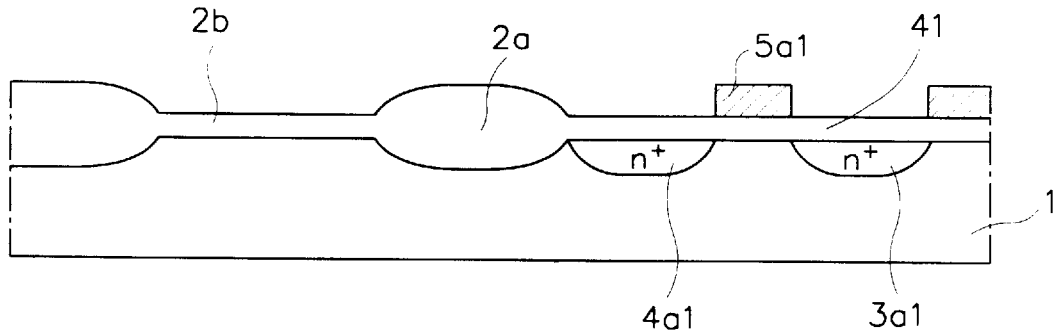
FIGS. 3A through 3G are cross-sectional process sequence views of the conventional TFT SRAM cell taken along line III—III in FIG. 2.
Figure 3B:
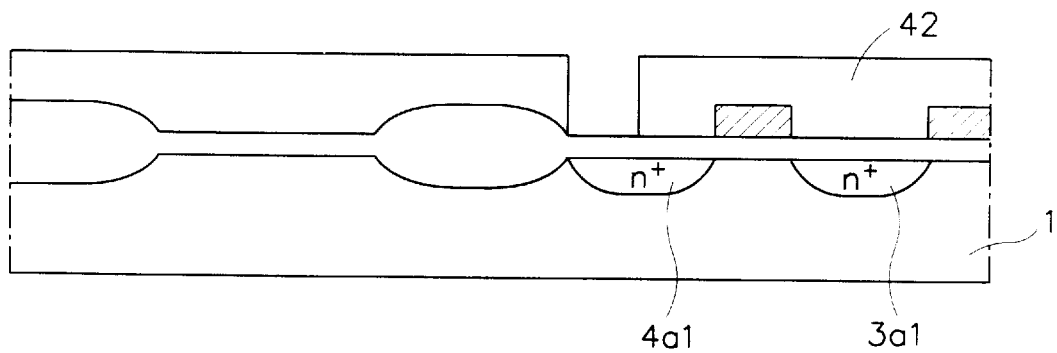
Figure 3C:
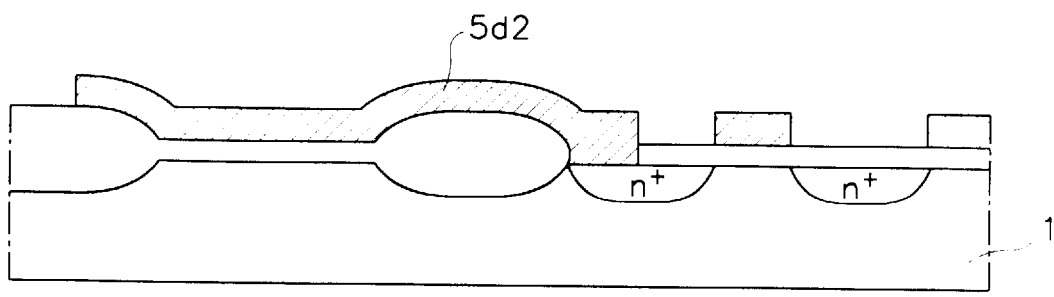
Figure 3D:
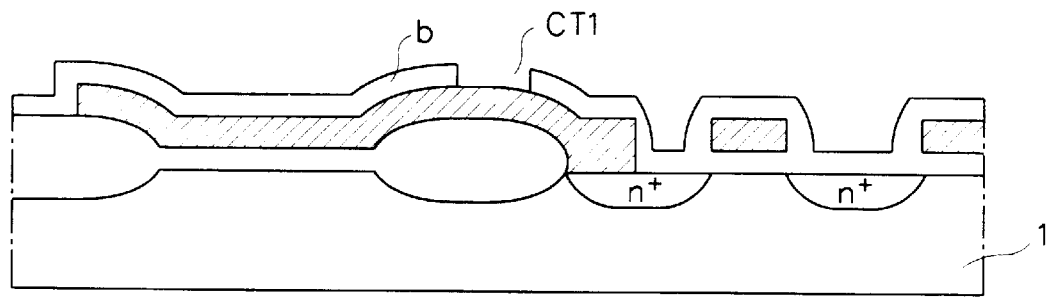
Figure 3E:
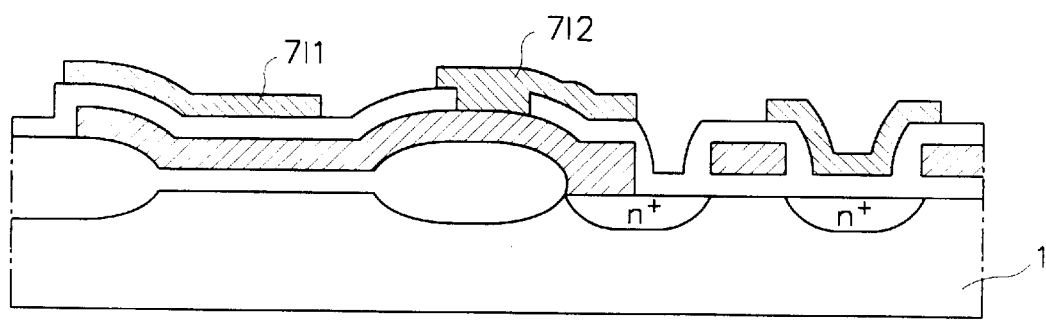
Figure 3F:
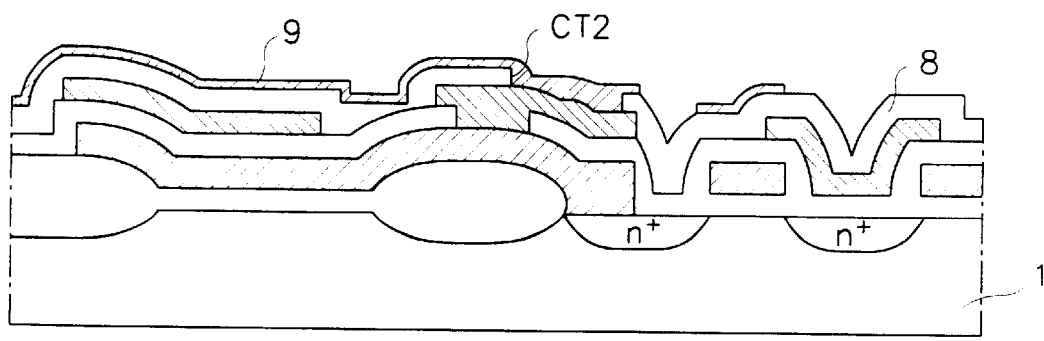
Figure 3G:
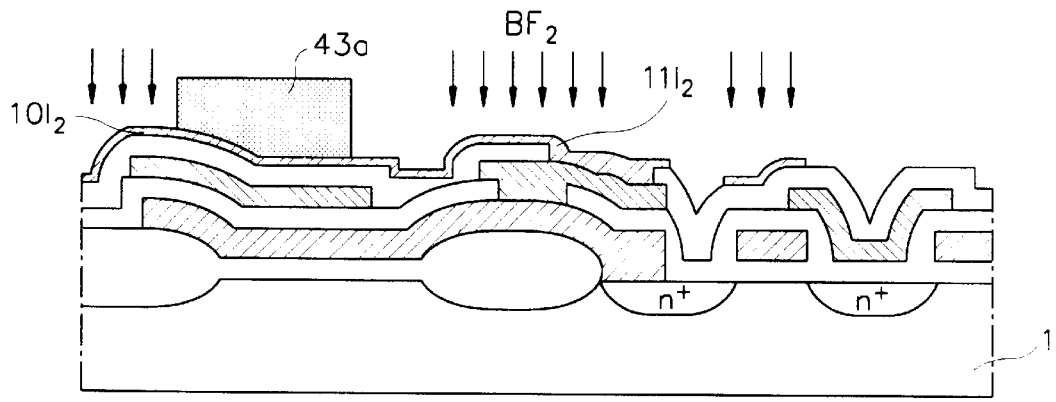
Figure 4A:
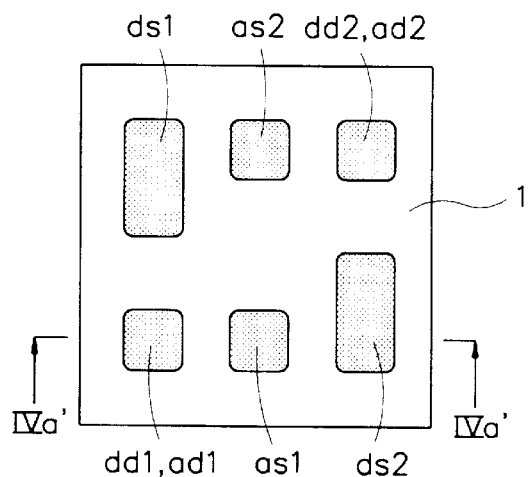
FIGS. 4A through 4K' are process views of a TFT SRAM cell according to the present invention.
Figure 4A:
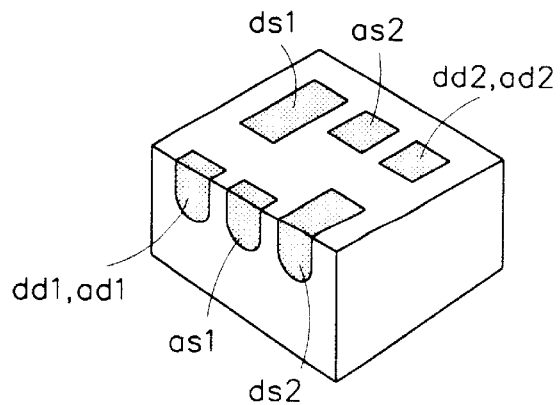
Figure 4B:
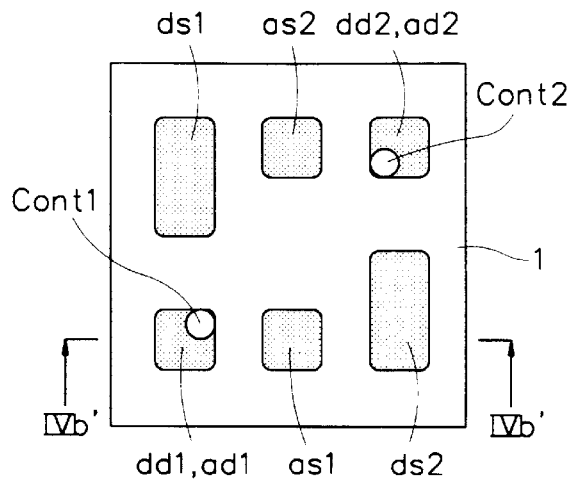
Figure 4B:
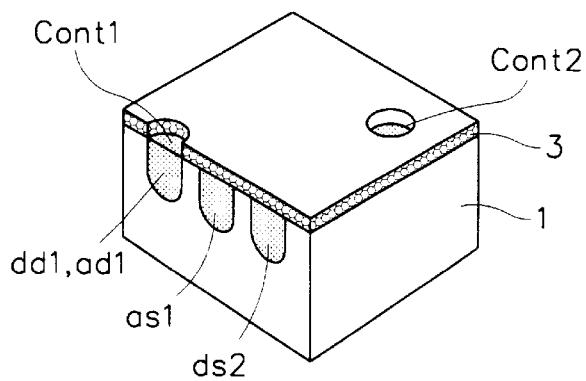
Figure 4C:
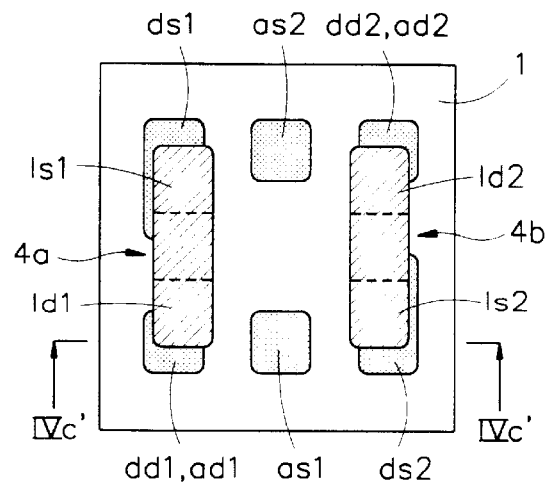
Figure 4C:
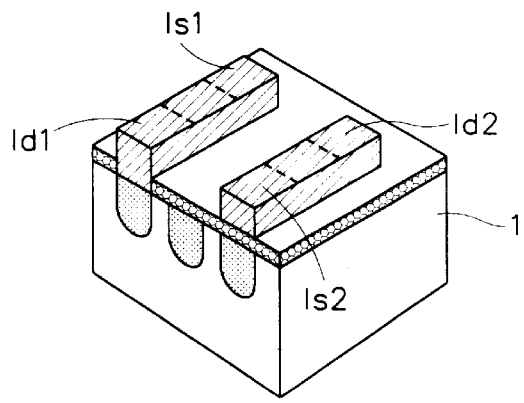
Figure 4D:
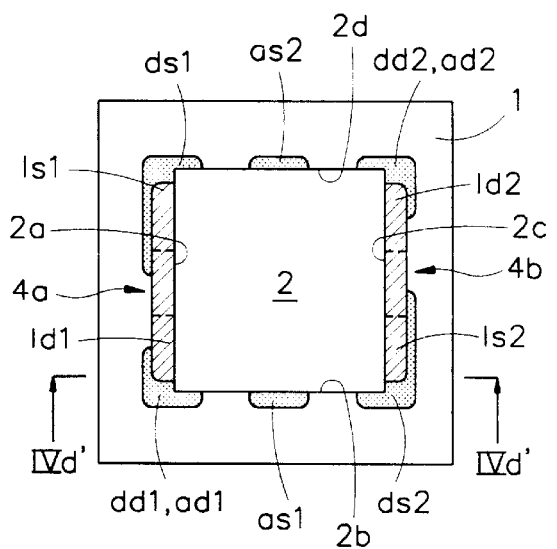
Figure 4D:
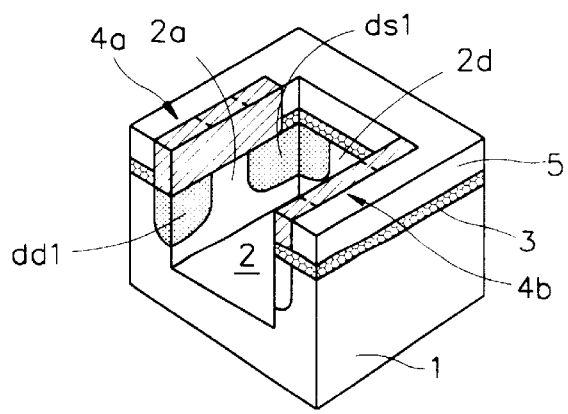

As shown in FIGS. 4D and 4D' respectively illustrating the structure of the SRAM cell according to the present invention, in the structure including a semiconductor substrate 1 there is formed a trench 2 having four walls, a first wall 2a, a second wall 2b, a third wall 2c and a fourth wall 2d. In the first wall 2a and third wall 2c, facing each other, of the four walls 2a, 2b, 2c, 2d of the trench 2 there are formed a second conductivity type impurity regions serving as source regions ds1, ds2 and drains dd1, dd2 of the first and second drive transistors Td1, Td2, respectively. The semiconductor substrate is formed of a first conductivity type that is opposite to the second conductivity type. Specifically, the source region ds1 and the drain dd1 of the first drive transistor Td1 are formed in the first wall 2a, and the source region ds2 and drain dd2 of the second drive transistor Td2 are formed in the third wall 2c. On the upper surface of the semiconductor substrate 1 corresponding to the first wall 2a there is formed a first active layer 4a serving as an active layer of the first load transistor Tl1. The first active layer 4a is formed of the second conductivity type. On the upper surface of the semiconductor substrate 1 corresponding to the third wall 2c there is formed a second active layer 4b serving as an active layer of the second load transistor Tl2. The second active layer 4b is also formed of the second conductivity type. A plurality of impurity regions of first conductivity type are formed in the first active layer and the second active layer. The impurity regions are employed as a source region ls1 and a drain region ld1 of the first load transistor Tl1 and as a source region ls2 and a drain region ld2 of the second load transistor Tl2. A wall of the first active layer 4a of the first load transistor Tl1 and the first wall 2a have a vertically aligned side edge. A wall of the second load transistor Tl2 and the third wall 2c also have a vertically aligned side edge.

Figure 4E:
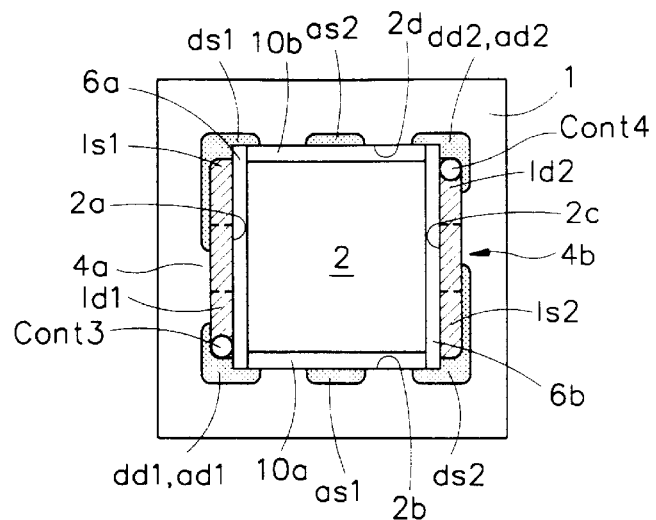
Figure 4F:
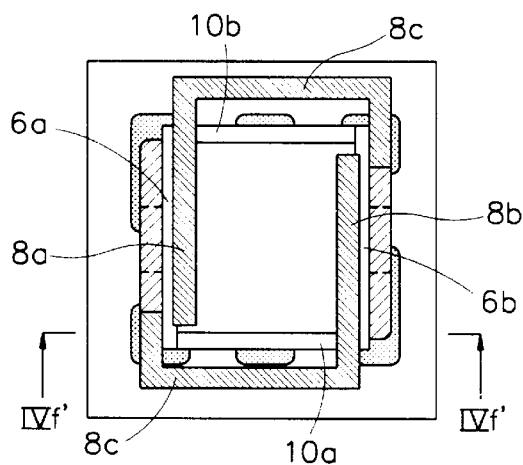
Figure 4F:
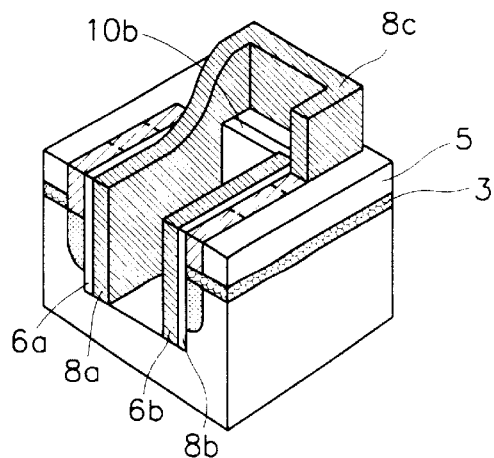
Figure 4G:
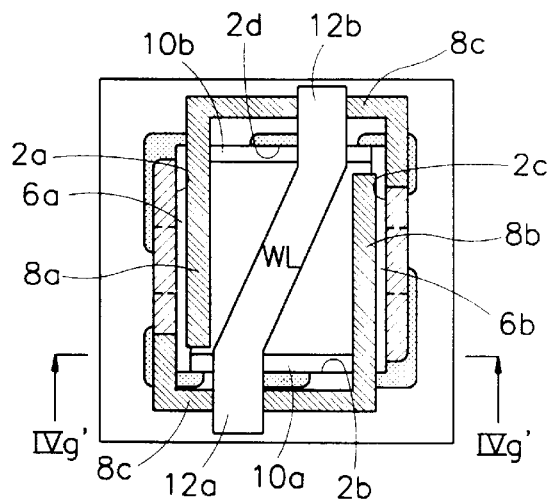
Figure 4G:
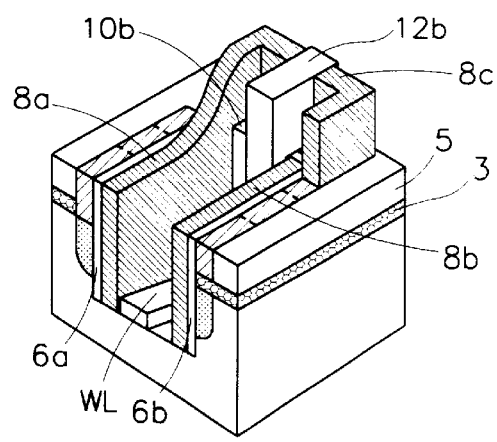

With reference to FIGS. 4G and 4G', a first gate oxide film 6a is formed on the wall of the first active layer 4a and the first wall 2a of the trench 2. A second gate oxide film 6b is formed on a wall of the second active layer 4b and the third wall 2c of the trench 2. On the side surface of the first gate oxide film 6a there is formed a first gate electrode 8a serving as a common gate electrode of the first load transistor Tl1 and the first drive transistor Td1. On the side surface of the second gate oxide film 6b there is formed a second gate electrode 8b serving as a common gate electrode of the second load transistor Tl2 and the second drive transistor Td2. Therefore, the channels of the first and the second drive transistors Td1, Td2 are formed to be perpendicular to the upper surface of the semiconductor substrate 1 and parallel to the surface of the each wall of the trench 2.

As further shown in FIGS. 4D and 4D', a source region as1 and drain region ad1 of the first access transistor Ta1 are formed in the second wall 2b facing the fourth wall 2d of the four walls 2a, 2b, 2c, 2d in the trench 2, and a source region as2 and drain region ad2 of the second access transistor Ta2 are formed in a fourth wall 2d facing the second wall 2b of the four walls 2a, 2b, 2c, 2d in the trench 2.

Referring to FIGS. 4G and 4G', a gate oxide film (not shown) for the first and second access transistors Ta1, Ta2 is formed on the second wall 2b and the fourth wall 2d, respectively. On the gate oxide film (not shown) are formed the gate electrodes 12a, 12b of the first and second access transistors Ta1, Ta2. On the bottom of the trench 2 there is formed a word line WL for connecting the gate electrode 12a to the gate electrode 12b. The drain region dd1 of the first drive transistor Td1 is shared with the drain region ad1 of the first access transistor Ta1. Also, the drain region dd2 of the second drive transistor Td2 is shared with the drain region ad2 of the second access transistor Ta2. The common drain region of ad1 and dd1 is located in the corner formed by first wall 2a and second wall 2b of the trench 2. Also the common drain region of ad2 and dd2 is located in the corner formed by the third wall 2c and the fourth wall 2d of the trench 2.

Figure 4H:
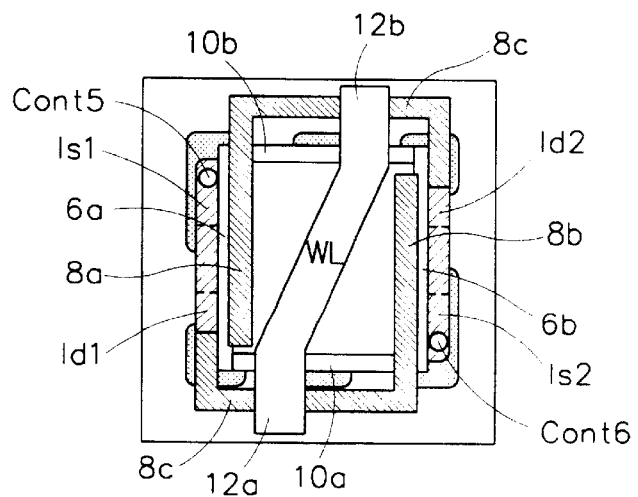
Figure 4I:
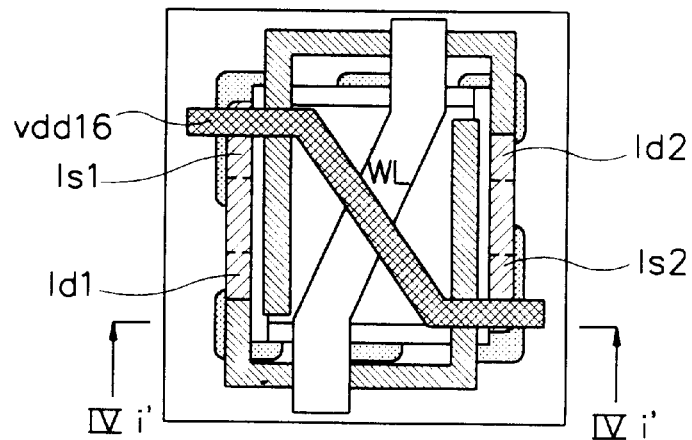
Figure 4I:
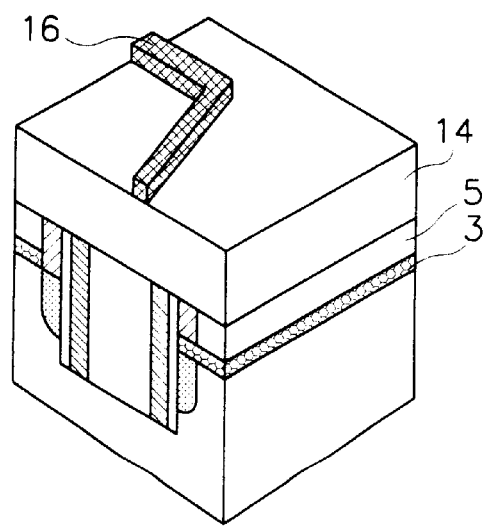
Figure 4J:
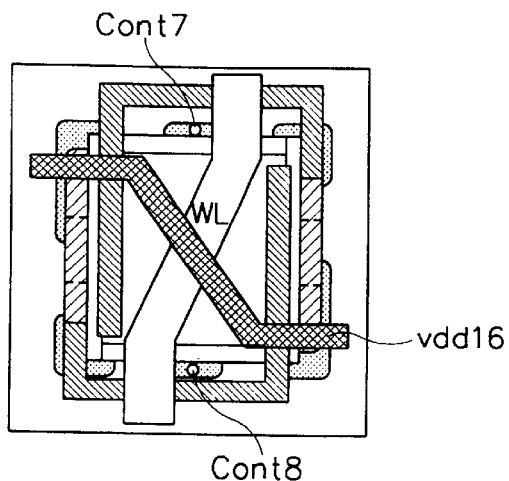
Figure 4K:
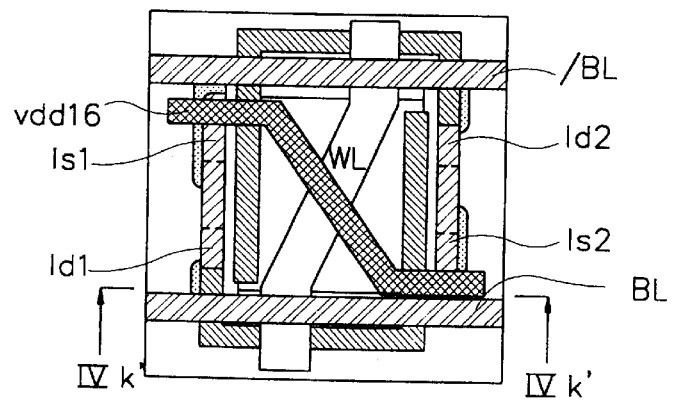
Figure 4K:
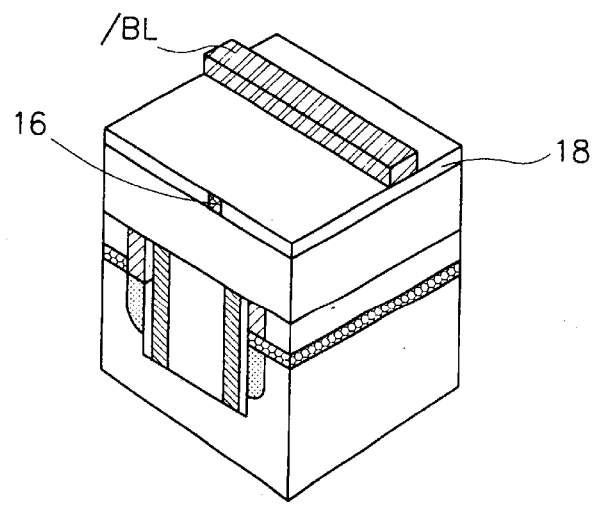

As shown in FIG. 4I', a Vdd line 16 is formed over the trench 2 and on an upper surface of an insulation layer formed on the thus far described entire pattern for thereby being connected to the source regions ls1, ls2 of the first and second load transistors Tl1, Tl2, and as further shown in FIG. 4K, on the so far described pattern there are formed a bit line BL connected to the source region as1 of the first access transistor Ta1 and a bar bit line /BL connected to the source region as2 of the second access transistor Ta2.

The fabrication method of the SRAM cell according to the present invention will now be described.

First, as shown in FIG. 4A which illustrates a plan view and in FIG. 4A' which illustrates a perspective view of a cross-section taken along line IVa'—IVa' in FIG. 4A, using ion-implantation, a plurality of impurity regions as1, ad1 and dd1, as2, ad2 and dd2, ds1 and ds2, are formed in the semiconductor substrate 1 to form source region ds1 and drain region dd1 of the first drive transistor Td1, source region ds2 and drain region dd2 of the second drive transistor Td2, source region as1 and drain region ad1 of the first access transistor Ta1, and source region as2 and drain region ad2 of the second access transistor Ta2.

As shown in FIG. 4B which illustrates a plan view and FIG. 4B' which illustrates a perspective cross sectional view taken along line IVb'—IVb' in FIG. 4B, an insulation film 3 is formed on the upper surface of the substrate 1. In the drain regions dd1, dd2 of the first and second drive transistors Td1, Td2 there are respectively formed through the insulation film 3, a first contact hole Cont1 for connecting the drain region dd1 of the first drive transistor Td1 and the drain region ld1 of the first load transistor Tl1 is formed, and a second contact hole Cont2 for connecting the drain region dd2 of the second drive transistor Td2 and the drain region ld2 of the second load transistor Tl2.

Using a LPCVD(Low Pressure Chemical Vapor Deposition) process at a temperature of 520° C. with SiH4 gas, an amorphous silicon layer is deposited in the contact holes Cont1, Cont2 and on the insulation layer 3 with a thickness of less than 40 nm, and an annealing is applied thereto at a low temperature so as to change the amorphous silicon layer into polysilicon layer. Then, as shown in FIG. 4C, the polysilicon layer is patterned using a photolithographic process and an etching process to form the first active layer 4a serving as an active layer for the first load transistor Tl1, and the second active layer 4b serving as an active layer for the second load transistor Tl2.

With reference to FIG. 4C which illustrates a plan view and FIG. 4C' which illustrates a perspective view of a cross-section taken along line IVc'—IVc' in FIG. 4C, an ion-implantation is carried out on predetermined portions of the active layers 4a, 4b for thereby forming the source regions ls1, ls2 and the drain regions ld1, ld2 of the first and second load transistors Tl1, Tl2. As shown in FIG. 4D', an SOG (Spin On Glass) insulation layer 5 is formed on the active layer 4 of the first and second load transistors Tl1, Tl2 and the insulation layer 3 for thereby planarizing the structure.

As shown in FIG. 4D, portions of the active layers 4a, 4b of the first and second load transistors Tl1, Tl2, the SOG layer 5 and the insulation layer 3 are anisotropically etched using an RIE (Reactive Ion Etching) process.

As further shown in FIG. 4D' illustrating a cross-section taken along line Ivd'—Ivd' in FIG. 4D, the above-described etching is continuously carried out into the semiconductor substrate 1 for thereby forming the trench 2 having four walls, the first wall 2a, the second wall 2b, the third wall 2c and the fourth wall 2d. Here, the trench 2 is formed to be deeper than the impurity regions as1, as2, ad1, ad2, ds1, ds2, dd1, dd2. The impurity regions as1, as2, ad1, ad2, ds1, ds2, dd1 and dd2 are exposed by forming the trench 2.

Referring to FIGS. 4E through 4F', with FIG. 4F' illustrating a perspective view of a cross-section taken along line IVf'—IVf in FIG. 4F, the first gate oxide film 6a is formed on the first wall 2a for forming the first drive transistor Td1 and a wall of the first active layer 4a serving as an active layer of the first load transistor Tl1, and the second gate oxide film 6b is formed on the third wall 2c for forming the second drive transistor Td2 and a wall of the second active layer 4b serving as an active layer of the second load transistor Tl2. Here, the first and second gate oxide films can be formed of one selected from SiO2, TESO, and SiO2/SiO3N4.

A third contact hole Cont 3 is formed in the drain region ld1 of the first load transistor Tl1, and a fourth contact hole Cont4 is formed in the drain region ld2 of the second load transistor Tl2. The third contact hole Cont3 serves to connect in common the second gate electrode 8b to the second load transistor Tl2 and the second drive transistor Td2, and the fourth contact hole Cont4 serves to connect in common the first gate electrode 8a to the first load transistor Tl1 and the first drive transistor Td1.

A polysilicon layer is deposited on the entire upper surface of the structure including the surface of the gate oxide layer 6a, 6b and the contact holes Cont3, Cont4, and patterned to form the first gate electrode 8a, the second gate electrode 8b and a polysilicon wire 8c, so that the first gate electrode 8a serving as a common gate electrode of the first load transistor Tl1 and the first drive transistor Td1 is formed on a side surface of the first gate oxide film 6a, and the second gate electrode 8b serving as a common gate electrode of the second load transistor Tl2 and the second drive transistor Td2 is formed on a side surface of the second gate oxide film 6b. On the upper surface of the structure, the second gate electrode 8b is connected through the third and fourth contact holes Cont3, Cont4 to the drain region dd1 of the first load transistor Tl1, and the polysilicon wire 8c is formed so as to connect the drain region dd2 of the second load transistor Tl2 to the first gate electrode 8a formed on a wall facing the drain region dd2.

Referring to FIGS. 4G and 4G', with FIG. 4G' being a perspective view of a cross-section taken along line IVg'—IVg' in FIG. 4G, an oxide films 10a, 10b are formed on the second wall 2b and the fourth wall 2d of trench 2. A polysilicon layer is deposited on the entire structure and patterned to there by form a gate electrode 12a, 12b of the first access transistor Ta1 and the second access transistor Ta2 on the side surface of oxide film 10a, 10b formed on the second wall 2b and fourth wall 2d respectively. And also, a word line connecting the gate electrode 12a and the gate electrode 12b is formed in the trench 2.

Referring to FIGS. 4H, 4I and 4I', with FIG. 4I' being a perspective view of a cross-section taken along lines IVi'—IVi' in FIG. 4I, an SOG film 14 is deposited in the trench 2 and on the upper surface of the structure for thereby planarizing the structure. In the source regions ls1, ls2 of the first and second load transistors Tl1, Tl2 there are formed fifth and sixth contact holes Cont5, Cont6. A conductive layer is formed in the contact holes Cont5, Cont6 and on the SOG film 14, and patterned for thereby forming the Vdd line 16. Here, the conductive layer 16 is formed of one selected from polysilicon, and metals such as aluminum, tungsten and metallic silicide.

Referring to FIGS. 4K and 4K', with FIG. 4K' being a perspective view of a cross-section taken along lines IVk'—IVk' FIG. 4K an insulation layer 18 is formed on the Vdd line 16 and the SOG layer 14, through which SOG layer 14. Seventh and eighth contact holes Cont7, Cont8 are respectively formed in the source regions as1, as2 of the first and second access transistors Ta1, Ta2. Another conductive layer is formed in the contact holes Cont7, Cont8 and on the insulation layer 18 and patterned, for thereby forming a bit line BL and a bar bit line /BL and thereby completing SRAM cell fabrication. Here, the conductive layer is formed of one selected from polysilicon and metals such as aluminum and tungsten.

The SRAM cell structure employing the trench formed according to the present invention is also applicable to the conventional high-resistance load SRAM cell which employs an undoped polysilicon layer as a load resistor. That is, in the TFT SRAM cell according to the present invention, the active layer for forming the load transistor may be replaced by an undoped silicon pattern which is employed as a load resistor, for thereby simplifying the high-resistance load SRAM cell fabrication.

Figure 5:
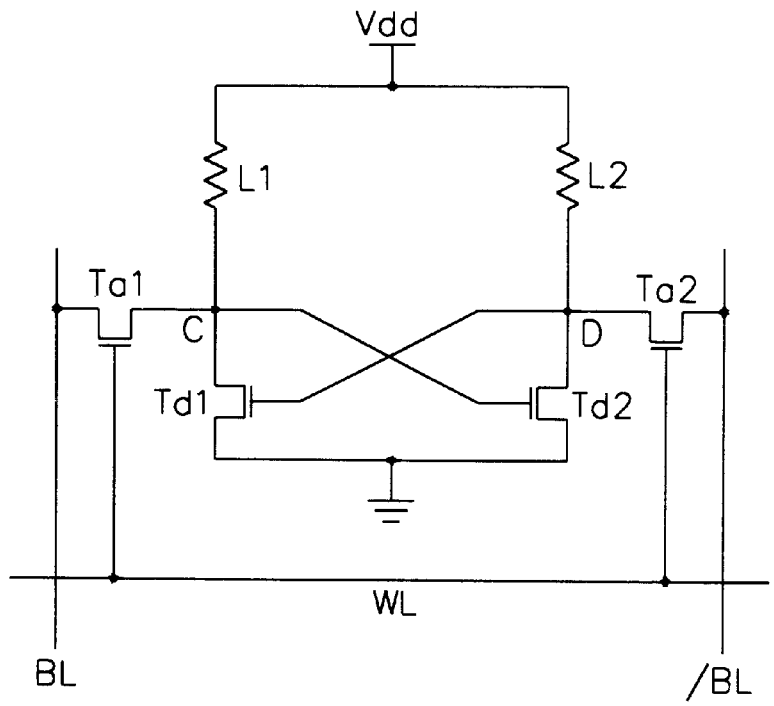
FIG. 5 is an equivalent circuit view of an SRAM cell using a load resistor.

The high-resistance load SRAM cell is illustrated as an equivalent circuit in FIG. 5, wherein the only difference thereof from a general TFT SRAM is that the first and second load transistors Tl1, Tl2 are replaced by the load resistors L1, L2, and the operation thereof is identical to that of the general TFT SRAM.

The structure of the high-resistance load SRAM cell provided with a trench and having an equivalent circuit as in FIG. 5 will now be described.

First, referring to FIGS. 6A through 6K, in the upper surface of a semiconductor substrate 1 there is formed a trench 2' having a plurality of walls, a namely first wall 2a', a second wall 2b', a third wall 2c' and a fourth wall 2d'. In a first wall 2a' and a third wall 2c' which face each other in the trench 2' there are formed impurity regions serving as source regions ds1, ds2 and drain regions dd1, dd2 of the first and second drive transistors Td1, Td2. Also, in the second wall 2b' and fourth wall 2d' which face each other in the trench 2' there are formed impurity regions serving as source regions as1, as2 and drain regions ad1, ad2 of the first and second access transistors Ta1, Ta2. A gate oxide film (not shown) is formed on the surface of each of the walls 2a', 2b', 2'c, 2d', and on a bottom surface in the trench 2'. First and second gate electrodes 38a, 38b of the first and second drive transistors Td1, Td2 are respectively formed on a corresponding side of the gate oxide film (not shown) formed on the first wall 2a' and the third wall 2c', and gate electrodes 40a, 40b of the first and second access transistors Ta1, Ta2 are respectively formed on the gate oxide film (not shown) formed on each of the second wall 2b' and fourth wall 2d'. On the bottom of the trench 2' there is formed a word line WL connecting the gate electrode 40a to the gate electrode 40b. On top of the structure corresponding to the first wall 2a' and the third wall 2c' of the trench 2' there are formed a first and second load resistors L1, L2, each end of which is connected to a Vdd line 42. On the upper surface of the Vdd line 42 there are formed a bit line BL and a bar bit line /BL respectively connected to the source regions as1, as2 of the first and second access transistors Ta1, Ta2.

The fabrication method of the thusly constituted high-resistance load SRAM cell having a trench will now be described with reference to FIGS. 6A through 6K.

Figure 6A:
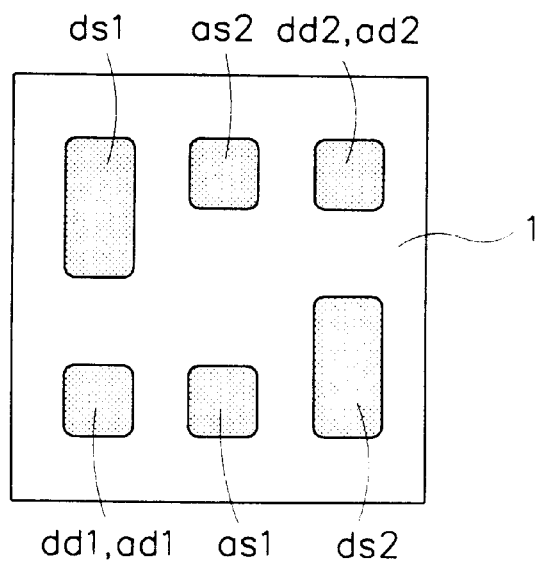
FIGS. 6A through 6K are process views of an SRAM cell using a load resistor according to the present invention.

Initially, as shown in FIG. 6A, impurities are ion-implanted into the semiconductor substrate 1 so as to form the source ds1 and the drain region dd1 of the first drive transistor Td1, the source region ds2 and the drain region dd2 of the second drive transistor Td2, the source region as1 and the drain region ad1 of the first access transistor Ta1, and the source region as2 and the drain region ad2 of the second access transistor Ta2. The drain region dd1 of the first drive transistor Td1 and the source region as1 of the first access transistor Ta1 share a common region, and the drain region dd2 of the second drive transistor Td2 and the source region as2 of the second access transistor Ta2 also share a common region.

Figure 6B:
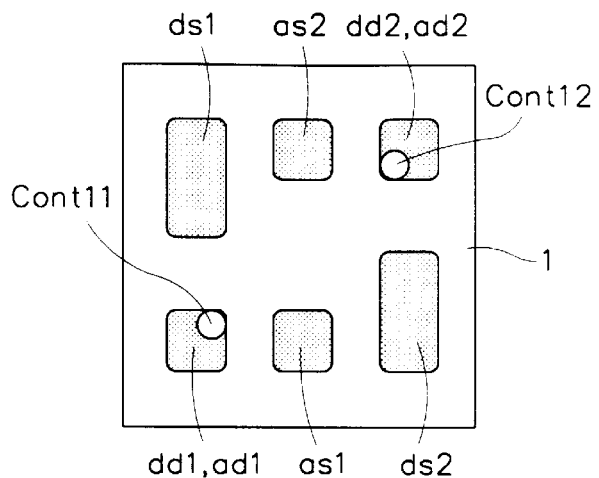

An insulation layer (not shown) is formed on the semiconductor substrate 1, and as shown in FIG. 6B, a contact hole Cont11 for connecting the drain region dd1 of the first drive transistor Td1 and the first load resistor L1 to be formed subsequently, and a contact hole Cont12 for connecting the drain region dd2 of the second drive transistor Td2 and the resistor L2 to be formed subsequently, are respectively formed in the drain regions dd1, dd2 of the first and second drive transistors Td1, Td2.

Figure 6C:
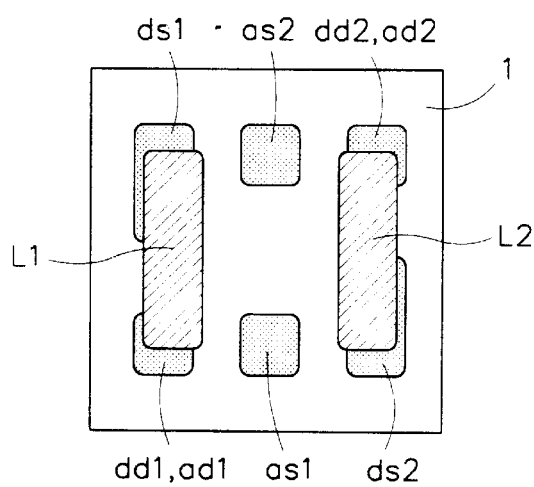

An undoped polysilicon layer is deposited in the contact holes Cont11, Cont12 and on the insulation layer (not shown), and patterned for thereby forming the first and second load resistors L1, L2 as shown in FIG. 6C. Then, an SOG film (not shown) is formed on the first and second load resistors L1, L2 and the insulation layer (not shown) to planarize the structure.

Figure 6D:
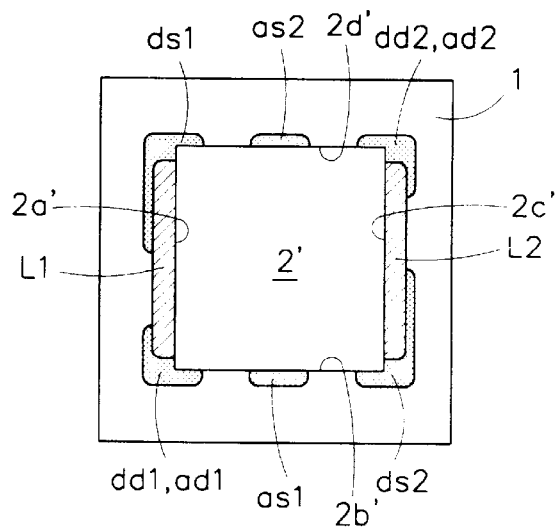

As shown in FIG. 6D, the first and second load resistors L1, L2 and the SOG film (not shown) are selectively etched, and the etching operation is continuously carried out into the semiconductor substrate 1 for thereby forming the trench 2'.

Figure 6E:
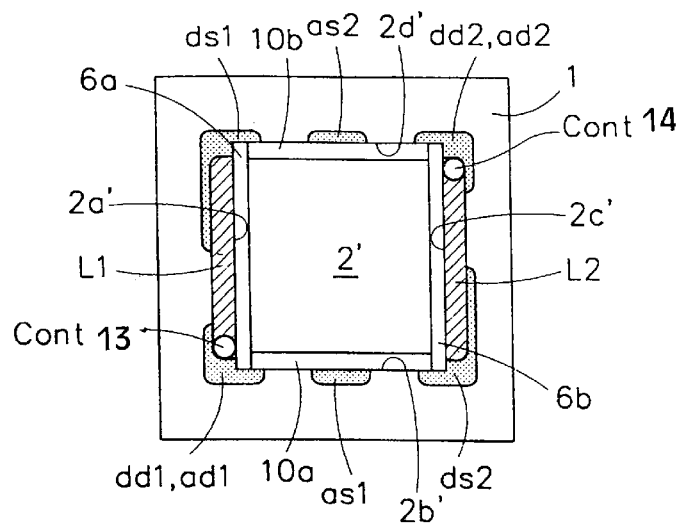
Figure 6F:
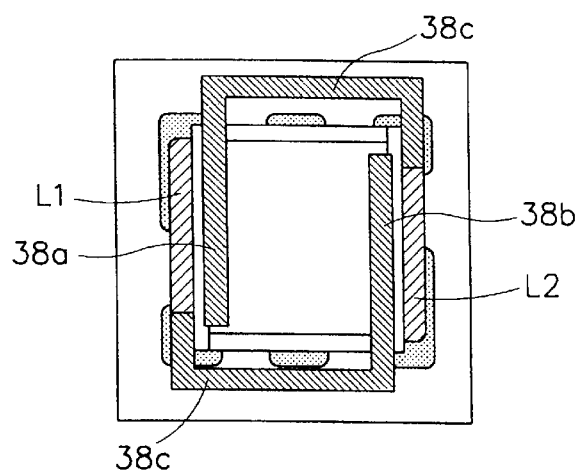

Next, a gate oxide film (not shown) serving as an insulation film is formed on each of the walls 2a', 2b', 2c', 2d' and on the bottom surface of the trench 2', and as shown in FIG. 6E, contact holes Cont13, Cont14 are formed for connecting an end of each regions of the first and second load resistors L1, L2 to a polysilicon wire 38c to be formed subsequently. A polysilicon layer is deposited on the structure including the gate oxide film (not shown) and the contact holes Cont13, Cont14 and patterned for thereby forming gate electrodes 38a, 38b of the first and second drive transistors Td1, Td2, and further forming a polysilicon wire 38c connecting the first and second load resistors L1, L2 to the gate electrodes 38b, 38a, respectively.

Figure 6G:
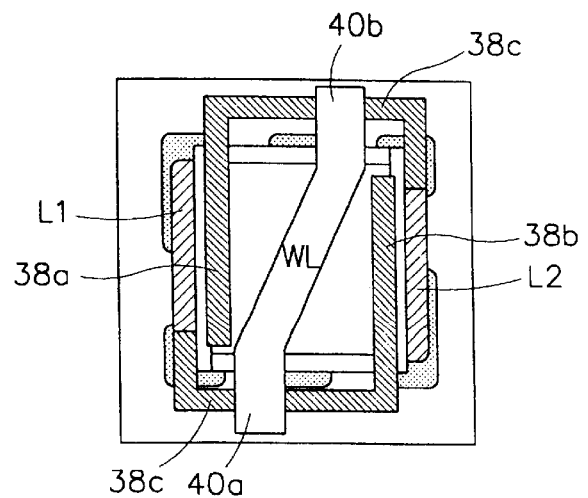

Referring to FIG. 6G, another insulation layer (not shown) is formed on the gate electrodes 38a, 38b, and the polysilicon wire 38c. Another polysilicon layer is deposited on the insulation layer and patterned for thereby forming gate electrodes 40a, 40b of the first and second access transistors Ta1, Ta2, and a word line WL connecting the gate electrode 40a and the gate electrode 40b.

Figure 6H:
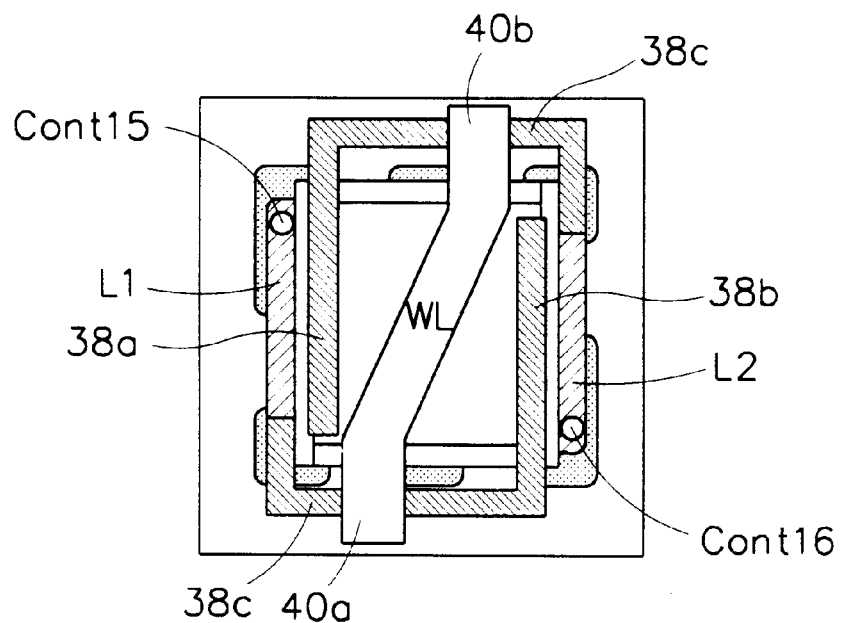
Figure 6I:
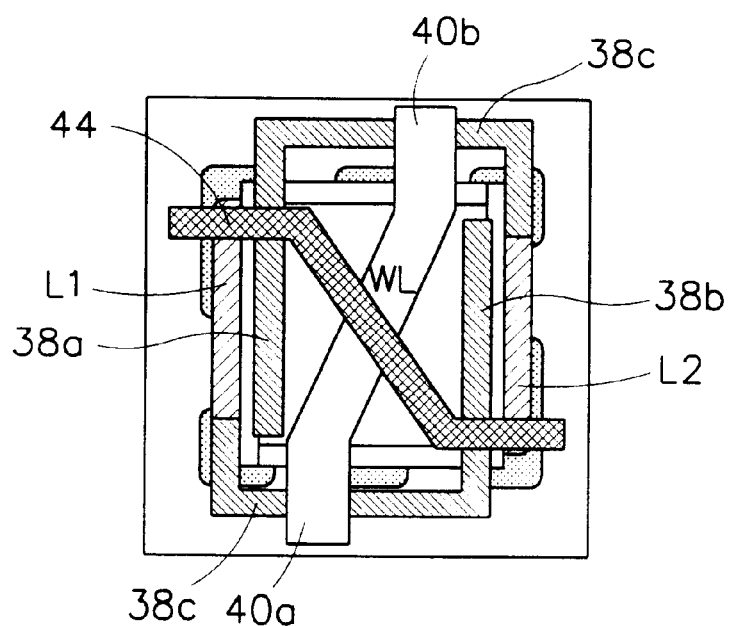
Figure 6J:
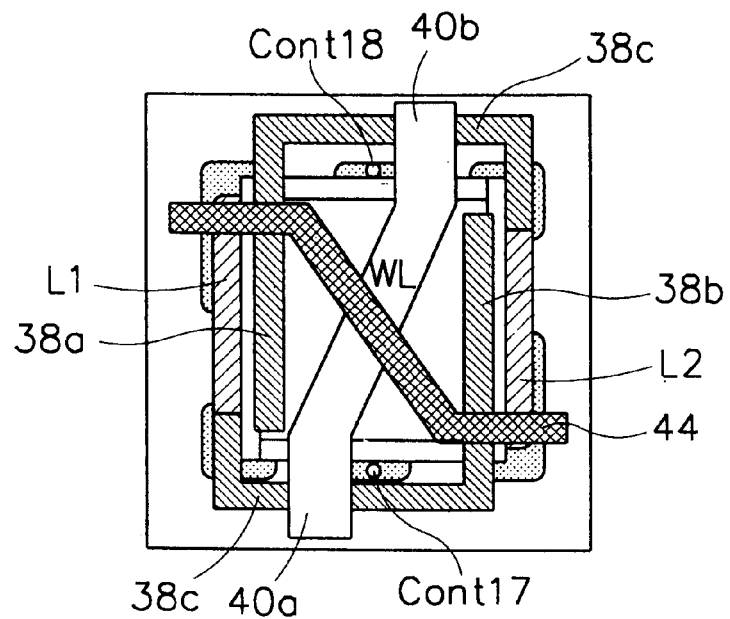
Figure 6K:
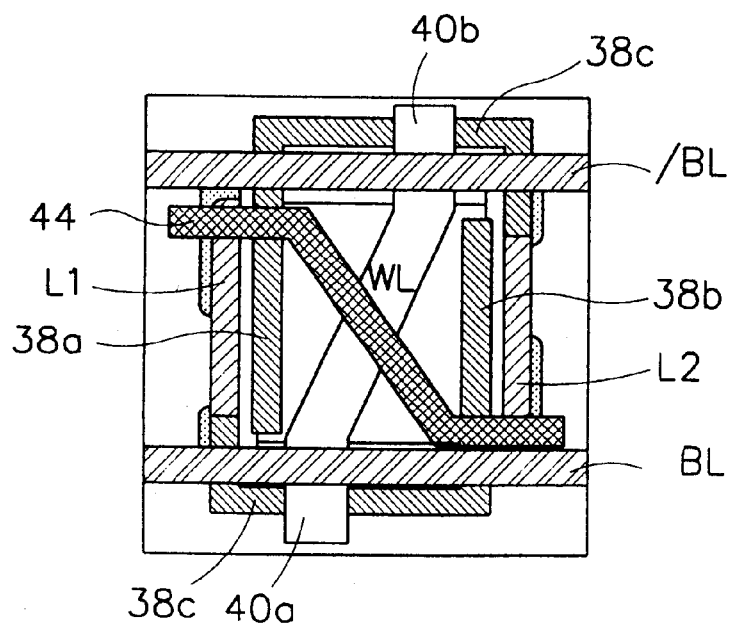

With reference to FIG. 6H, an insulation layer (not shown) is deposited on the upper surface of the resultant structure and in the trench 2' for thereby planarizing the structure. Contact holes Cont15, Cont16 for connecting an end of each the first and second resistors L1, L2 to the Vdd line 44 to be formed subsequently are respectively formed in the first and second load resistors L1, L2. As shown in FIG. 6I, a polysilicon layer or a metallic layer is formed in the contact holes Cont15, Cont16 and on the insulation layer (not shown), and patterned for thereby forming the Vdd line 44. Then, as shown in FIG. 6J, an insulation layer (not shown) is formed on the Vdd line 44, and in this insulation layer (not shown) there are formed contact holes Cont17, Cont18 for connecting the source regions as1, as2 of the first and second access transistors Ta1, Ta2 to the bit line BL and the bar bit line /BL to be formed subsequently. A polysilicon layer or a metallic layer is formed in the contact holes Cont17, Cont18 and on the insulation layer (not shown) and patterned so as to form the bit line BL and the bar bit line /BL as shown in FIG. 6K, thereby completing the fabrication of the high-load resistance SRAM cell according to the present invention.

As described above, the trench type SRAM cell according to the present invention has an advantage in that the gate electrodes of the load transistors and the drive transistors are formed vertically, thereby decreasing an area occupied by the gate electrodes in width.

Further, the gate electrodes of the access transistors are vertically formed, i.e. perpendicularly to an upper surface of the semiconductor substrate instead of being formed on the substrate, thereby decreasing the area occupied by the transistors, whereby the SRAM cell size decreased, and accordingly the integration degree as well as productivity and cost effectiveness thereof are becomes enhanced.

Still further, the conventional problem of forming a butting contact at a contact point between the gate electrodes of an access transistor and a drive transistor is solved according to the present invention, thereby facilitating the fabrication steps thereof as well as improving reliability.

What is claimed is:

1. A semiconductor memory device including first and second access transistors, first and second drive transistors, and first and second load resistors, a first cell node having a first terminal of the first access transistor, a gate electrode of the second drive transistor and a terminal of the first load resistor connected thereto in common, and a second cell node having a first terminal of the second access transistor, a gate electrode of the first drive transistor and a terminal of the second load resistor connected thereto in common, the semiconductor memory device comprising:
    a trench formed in a semiconductor substrate and having at least two walls including a first wall and a second wall; and
    the first drive transistor including a source region and a drain region formed at a depth on the first wall and the second drive transistor including a source region and a drain region formed at a depth on the second wall of the trench, and the gate electrode of the first drive transistor formed on the first wall and the gate electrode of the second drive transistor formed on the second wall of the trench.

2. The semiconductor memory device of claim 1, the first and the second walls of the trench face each other.

3. The semiconductor memory device of claim 1, wherein channels of the first and the second drive transistors are respectively formed at the first and the second walls of the trench and are perpendicular to an upper surface of the semiconductor substrate.

4. The semiconductor memory device of claim 1, wherein the first and second load resistors are formed of an undoped polysilicon layer.

5. A semiconductor memory device including first and second access transistors, first and second drive transistors, and first and second load resistors, a first cell node having a terminal of the first access transistor, a gate electrode of the second drive transistor and a terminal of the first load resistor connected thereto in common, and a second cell node having a terminal of the second access transistor, a gate electrode of the first drive transistor and a terminal of the second load resistor connected thereto in common, the semiconductor memory device comprising:
    a trench formed in a semiconductor substrate and having at least two walls including a first wall and a second wall; and
    the first access transistor including a source region and a drain region formed nearby the gate electrode of the first drive transistor and at a depth on the first wall of the trench, and the second access transistor including a source region and a drain region formed nearby the gate electrode of the second drive transistor and at a depth on the second wall of the trench in the semiconductor substrate.

6. The semiconductor memory device of claim 5, wherein the first and the second walls of the trench face each other.

7. The semiconductor memory device of claim 5, wherein channels of the first and the second access transistors are respectively formed on the first and the second walls of the trench and are perpendicular to an upper surface of the semiconductor substrate.

8. The semiconductor memory device of claim 5, wherein the first and second load resistors are formed of an undoped polysilicon layer.

9. A semiconductor memory device including first and second access transistors, first and second drive transistors, and first and second load resistors, a first cell node having a first terminal of the first access transistor, a gate electrode of the second drive transistor and a terminal of the first load resistor connected thereto in common and a second cell node having a first terminal of the second access transistor, a gate electrode of the first drive transistor and a terminal of the second load resistor connected thereto in common, the semiconductor memory device comprising:
    a semiconductor substrate;
    a trench formed in the semiconductor substrate and having at least four walls including a first wall, a second wall, a third wall and a fourth wall, wherein the first drive transistor and the second drive transistor, each including a source region, a drain region and a gate electrode are formed at the first wall and the third wall of the trench, respectively;
    the first access transistor and the second access transistor each including a source region, a drain region and a gate electrode are formed at the second wall and the fourth wall of the trench, respectively; and
    the first load resistor and the second load resistor are formed over an upper surface of the semiconductor substrate corresponding to the first and third walls of the trench, respectively.

10. The semiconductor memory device of claim 9, wherein the first and the second load resistors are formed of an undoped polysilicon layer.

11. A semiconductor memory device including first and second access transistors, first and second drive transistors, and first and second load transistors, a first cell node having a terminal of the first access transistor, a gate electrode of the second drive transistor and a gate electrode of the second load transistor connected thereto in common, and a second cell node having a terminal of the second access transistor, a gate electrode of the first drive transistor and a gate electrode of the first load transistor connected thereto in common, the semiconductor memory device comprising:

a trench formed in a semiconductor substrate and having at least two walls including a first wall and a second wall; and the first drive transistor including a source region and a drain region formed in the first wall and the second drive transistor including a source region and a drain region formed in the second wall of the trench, and one of the gate electrode of the first drive transistor and the gate electrode of the first load transistor formed on the first wall and one of the gate electrode of the second drive transistor and the gate electrode of the second load transistor formed on the second wall of the trench.

12. The semiconductor memory device of claim 11, wherein the first load transistor further comprises:

an active layer formed on an upper surface of the semiconductor substrate corresponding to the first wall of the trench;

one of the gate electrode of the first drive transistor and the gate electrode of the first load transistor formed on a wall of the active layer;

the source region and the drain region formed respectively in each side of one of the gate electrode of the first drive transistor and the gate electrode of the first load transistor in the active layer.

13. The semiconductor memory device of claim 12, wherein the gate electrode of the first drive transistor and the gate electrode of the first load transistor are connected to the second cell node in common.

14. The semiconductor memory device of claim 12, wherein the gate electrode of the second drive transistor and the gate electrode of the second load transistor are connected to the first cell node in common.

15. The semiconductor memory device of claim 11, wherein the second load transistor further comprises:

an active layer formed on an upper surface of the semiconductor substrate corresponding to the second wall of the trench;

one of the gate electrode of the second drive transistor and the gate electrode of the second load transistor formed on a wall of the active layer; and the source region and the drain region formed respectively in each side of one of the gate electrode of the second drive transistor and the gate electrode of the second load transistor in the active layer.

16. A semiconductor memory device including first and second access transistors, first and second drive transistors, and first and second load transistors, a first cell node having a terminal of the first access transistor, a gate electrode of the second drive transistor and a gate electrode of the second load transistor connected thereto in common, and a second cell node having a terminal of the second access transistor, a gate electrode of the first drive transistor and a gate electrode of the first load transistor connected thereto in common, the semiconductor memory device comprising:

a trench formed in a semiconductor substrate and having at least two walls including a first wall and a second wall; and the first access transistor including a source region and a drain region formed nearby the gate electrode of the first drive transistor and the gate electrode of the first load transistor and at a depth on the first wall of the trench, and the second access transistor including a source region and a drain region formed nearby the gate electrode of the second drive transistor and the gate electrode of the second load transistor and at a depth on the second wall of the trench in the semiconductor substrate.

17. A semiconductor memory device including first and second access transistors, first and second drive transistors, and first and second load transistors, a first cell node having a terminal of the first access transistor, a gate electrode of the second drive transistor and a gate electrode of the second load transistor connected thereto in common and a second cell node having a terminal of the second access transistor, a gate electrode of the first drive transistor and a gate electrode of the first load transistor connected thereto in common, the semiconductor memory device comprising:

a semiconductor substrate;

a trench formed in the semiconductor substrate and having a least four walls including a first wall, a second wall, a third wall and a fourth wall, wherein the first drive transistor and the second drive transistor, each including a source region, a drain region and a gate electrode are formed at the first wall and the third wall of the trench, respectively;

the first access transistor and the second access transistor each including a source region, a drain region and a gate electrode are formed at the second wall and the fourth wall of the trench, respectively; and the first load transistor and the second load transistor are formed over an upper surface of the semiconductor substrate corresponding to the first and third walls of the trench, respectively.

* * * * *